United States Patent
Sengupta et al.

(10) Patent No.: US 9,436,596 B2
(45) Date of Patent: *Sep. 6, 2016

(54) FLASH MEMORY CACHE INCLUDING FOR USE WITH PERSISTENT KEY-VALUE STORE

(71) Applicant: MICROSOFT TECHNOLOGY LICENSING, LLC, Redmond, WA (US)

(72) Inventors: Sudipta Sengupta, Redmond, WA (US); Biplob Kumar Debnath, Minneapolis, MN (US); Jin Li, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/919,727

(22) Filed: Jun. 17, 2013

(65) Prior Publication Data
US 2013/0282964 A1  Oct. 24, 2013

Related U.S. Application Data

(63) Continuation of application No. 12/773,859, filed on May 5, 2010, now abandoned.

(51) Int. Cl.
*G06F 12/02* (2006.01)
*G06F 12/08* (2016.01)
(Continued)

(52) U.S. Cl.
CPC ....... *G06F 12/0246* (2013.01); *G06F 12/0866* (2013.01); *G06F 12/123* (2013.01); *G11C 7/1072* (2013.01); *G06F 12/0897* (2013.01); *G06F 2212/222* (2013.01)

(58) Field of Classification Search
CPC ........... G06F 12/0246; G06F 12/0866; G06F 12/123

USPC .......................................... 711/216, E12.06
See application file for complete search history.

(56) References Cited

U.S. PATENT DOCUMENTS 5,634,125 A   5/1997  Li et al.
6,412,080 B1  6/2002  Fleming et al.
(Continued)

FOREIGN PATENT DOCUMENTS

CN   101350869 A   1/2009
CN   101706825 A   5/2010
(Continued)

OTHER PUBLICATIONS

Liu, "ADMAD: Application-Driven Metadata Aware De-duplication Archival Storage System", In Proceedings of the Fifth International Workshop on Storage Network Architecture and Parallel I/Os. Sep. 22, 2008, pp. 29-35.
(Continued)

*Primary Examiner* — Edward Dudek, Jr.
(74) *Attorney, Agent, or Firm* — Steve Wight; Sandy Swain; Micky Minhas

(57) ABSTRACT

Described is using flash memory, RAM-based data structures and mechanisms to provide a flash store for caching data items (e.g., key-value pairs) in flash pages. A RAM-based index maps data items to flash pages, and a RAM-based write buffer maintains data items to be written to the flash store, e.g., when a full page can be written. A recycle mechanism makes used pages in the flash store available by destaging a data item to a hard disk or reinserting it into the write buffer, based on its access pattern. The flash store may be used in a data deduplication system, in which the data items comprise chunk-identifier, metadata pairs, in which each chunk-identifier corresponds to a hash of a chunk of data that indicates. The RAM and flash are accessed with the chunk-identifier (e.g., as a key) to determine whether a chunk is a new chunk or a duplicate.

20 Claims, 7 Drawing Sheets

(51) Int. Cl.
*G06F 12/12* (2016.01)
*G11C 7/10* (2006.01)

(56) References Cited

U.S. PATENT DOCUMENTS

| | | |
|---|---|---|
| 6,418,515 B1 | 7/2002 | Kurosawa |
| 6,453,404 B1* | 9/2002 | Bereznyi et al. ............ 711/171 |
| 6,687,815 B1 | 2/2004 | Dwyer, III et al. |
| 6,928,526 B1 | 8/2005 | Zhu et al. |
| 6,970,639 B1 | 11/2005 | McGrath et al. |
| 6,976,229 B1 | 12/2005 | Balabanovic et al. |
| 7,076,602 B2 | 7/2006 | Stark et al. |
| 7,096,213 B2 | 8/2006 | Chatterjee et al. |
| 7,457,934 B2 | 11/2008 | Yagawa |
| 7,567,188 B1 | 7/2009 | Anglin et al. |
| 7,640,262 B1 | 12/2009 | Beaverson et al. |
| 7,725,830 B2 | 5/2010 | Vronay |
| 7,827,182 B1 | 11/2010 | Panigrahy |
| 2003/0093645 A1 | 5/2003 | Wong et al. |
| 2003/0182310 A1 | 9/2003 | Charnock et al. |
| 2004/0034869 A1 | 2/2004 | Wallace et al. |
| 2004/0037540 A1 | 2/2004 | Frohlich et al. |
| 2004/0111443 A1 | 6/2004 | Wong et al. |
| 2005/0008343 A1 | 1/2005 | Frohlich et al. |
| 2005/0281541 A1 | 12/2005 | Logan et al. |
| 2006/0112112 A1* | 5/2006 | Margolus et al. ............ 707/100 |
| 2006/0277180 A1 | 12/2006 | Okamoto |
| 2007/0005874 A1 | 1/2007 | Dodge |
| 2007/0074115 A1 | 3/2007 | Patten et al. |
| 2007/0094277 A1 | 4/2007 | Fachan et al. |
| 2007/0106876 A1 | 5/2007 | Goswami |
| 2008/0005141 A1 | 1/2008 | Zheng et al. |
| 2008/0007567 A1 | 1/2008 | Clatworthy et al. |
| 2008/0010238 A1 | 1/2008 | Whyte et al. |
| 2008/0016149 A1 | 1/2008 | Shitomi et al. |
| 2008/0133561 A1 | 6/2008 | Dubnicki et al. |
| 2008/0243992 A1 | 10/2008 | Jardetzky et al. |
| 2008/0294696 A1 | 11/2008 | Frandzel |
| 2008/0306925 A1 | 12/2008 | Campbell et al. |
| 2009/0013129 A1 | 1/2009 | Bondurant |
| 2009/0019345 A1 | 1/2009 | Kaufman et al. |
| 2009/0089483 A1 | 4/2009 | Tanaka et al. |
| 2009/0171888 A1 | 7/2009 | Anglin |
| 2009/0177855 A1 | 7/2009 | Drews et al. |
| 2009/0193182 A1* | 7/2009 | Nitta ............................ 711/103 |
| 2009/0210640 A1 | 8/2009 | Davis |
| 2009/0238538 A1 | 9/2009 | Fink |
| 2009/0254507 A1 | 10/2009 | Hosoya et al. |
| 2009/0268903 A1 | 10/2009 | Bojinov et al. |
| 2009/0271454 A1 | 10/2009 | Anglin et al. |
| 2009/0300321 A1 | 12/2009 | Balachandran et al. |
| 2009/0319547 A1 | 12/2009 | Hollis |
| 2010/0005380 A1 | 1/2010 | Lanahan et al. |
| 2010/0005417 A1 | 1/2010 | Lanahan et al. |
| 2010/0011028 A1 | 1/2010 | Dade |
| 2010/0042790 A1 | 2/2010 | Mondal et al. |
| 2010/0058013 A1 | 3/2010 | Gelson et al. |
| 2010/0077013 A1 | 3/2010 | Clements et al. |
| 2010/0088296 A1 | 4/2010 | Periyagaram et al. |
| 2010/0094817 A1 | 4/2010 | Ben-Shaul et al. |
| 2010/0223128 A1 | 9/2010 | Dukellis et al. |
| 2010/0241629 A1 | 9/2010 | Tatemura et al. |
| 2010/0250858 A1 | 9/2010 | Cremelie et al. |
| 2010/0250896 A1 | 9/2010 | Matze |
| 2010/0299311 A1 | 11/2010 | Anglin et al. |
| 2010/0312752 A1 | 12/2010 | Zeis et al. |
| 2011/0307447 A1 | 12/2011 | Sabaa et al. |
| 2011/0307683 A1 | 12/2011 | Spackman |
| 2012/0030477 A1 | 2/2012 | Lu et al. |
| 2012/0036319 A1 | 2/2012 | Bondurant |
| 2012/0124282 A1 | 5/2012 | Frank et al. |
| 2012/0150823 A1 | 6/2012 | Tofano |

FOREIGN PATENT DOCUMENTS

| | | |
|---|---|---|
| CN | 101916171 A | 12/2010 |
| EP | 2012235 A2 | 1/2009 |
| EP | 2216710 A2 | 8/2010 |
| WO | 2009/132968 A1 | 11/2009 |

OTHER PUBLICATIONS

Li, et al., "b-Bit Minwise Hashing", In Proceedings of the 19th International Conference on World Wide Web, Apr. 26, 2010, 10 Pages.

Mearian, Lucas, "MySpace Replaces All Server Hard Disks with Flash Drives", Published on: Oct. 2009, Available at: http://www.computerworld.com/s/article/9139280/MySpace_replaces_all_server_hard_disc, 4 pages.

Meister, Dirk, "dedupv1: Improving Deduplication Throughput using Solid State Drives (SSD)", In Proceedings of the 26th International Symposium on Mass Storage Systems and Technologies, May 3, 2010, 6 Pages.

Muthitacharoen, et al., "A Low-Bandwidth Network File System", In Proceedings of the ACM Symposium on Operating Systems Principles, Oct. 21, 2001, 14 Pages.

Narayanan, et al.,"Everest: Scaling Down Peak Loads through I/O Off-Loading", In Proceedings of the Conference on Operating Systems Design and Implementation, vol. 8, Dec. 2008, 15-28 Pages.

Nath, et al. "Flash DB: Dynamic Self-tuning Database for NAND Flash", In Proceedings of the 6th International Conference on Information Processing in Sensor Networks, Apr. 25, 2007, 10 Pages.

Nath, et al., "Online Maintenance of Very Large Random Samples on Flash Storage", In Proceedings of the VLDB Endowment, vol. 1, Issue 1, Aug. 24, 2008, pp. 1-14.

Norheim, Hans Olav, "How Flash Memory Changes the DBMS1 World an Introduction", Published on: Apr. 22, 2008 Available at: http://www.hansolav.net/blog/content/binary/HowFlashMemory.pdf, 12 pages.

Ousterhout, et al., "The case for RAMClouds: Scalable High-performance Storage Entirely in DRAM", In Proceedings of the Operating Systems Review, vol. 43, Issue 4, Jan. 27, 2010, 14 Pages.

"Understanding the HP Data Deduplication Strategy", Published on: May, 2008, Available at: http://www.usdatavault.com/library/understanding%20deduplication.pdf, 28 pages.

Pagh, et al., "Cuckoo Hashing", In Journal of Algorithms, vol. 51, Issue 2, May, 2004, pp. 1-27.

Quinlan, et al., "Venti: A New Approach to Archival Data Storage", In Proceedings of the 1st USENIX Conference on File and Storage Technologies, vol. 2, Jan. 30, 2002, 13 Pages.

Rabin, Michael, "Fingerprinting by Random Polynomials", In Center for Research in Computing Technology, 1981, 14 Pages.

Rosenblum, "The Design and Implementation of a Log-Structured File System", In Proceedings of the Transactions on Computer Systems, vol. 10, Issue 1, Feb. 1, 1992, 15 Pages.

Saab, Paul, "Releasing Flashcache", Published on: Apr. 27, 2010, Available at: https://www.facebook.com/note.php?note_id=388112370932, 1 page.

Silberschatz, et al., "Operating System Concepts", Addison-Wesley, Jan. 15, 1998, 76 Pages.

Spivak, et al., "Storing a Persistent Transactional Object Heap on Flash Memory", In Proceedings of the ACM SIGPLAN Notices, vol. 41, Issue 7, Jun. 14, 2006, pp. 22-33.

Stoica, et al., "Chord: A Scalable Peer-to-Peer Lookup Service for Internet Applications", In Proceedings of the Conference on Applications, Technologies, Architectures, and Protocols for Computer Communications, vol. 31 Issue 4, Aug. 27, 2001, 12 Pages.

Ungureanu, et al., "HydraFS: A High-Throughput File System for the HYDRAstor Content-Addressable Storage System", In Proceedings of the 8th USENIX Conference on File and Storage Technologies, Feb. 23, 2010, 14 Pages.

(56) References Cited

OTHER PUBLICATIONS

Walfish, et al., "Distributed Quota Enforcement for Spam Control", In Proceeding of the Symposium on Networked Systems Design and Implementation, May 2006, pp. 281-296.

Wei, et al., "MAD2: A Scalable High-Throughput Exact Deduplication Approach for Network backup Services", In Proceedings of the Symposium on Mass Storage Systems and Technologies, May 3, 2010, 14 Pages.

Won Lee, et al., "A Case for Flash Memory SSD in Enterprise Database Applications", In Proceedings of the International Conference on Management of Data, Jun. 9, 2008, pp. 1075-1086.

Wu, et al., "Envy: A Non-Volatile, Main Memory Storage System", In Proceedings of the Sixth International Conference on Architectural Support for Programming Languages and Operating Systems, Nov. 1, 1994, pp. 86-97.

Xing, et al., "PeerDedupe: Insights into the Peer-assisted Sampling Deduplication", In Proceedings of the Tenth International Conference on Peer-to-Peer Computing, Aug. 25, 2010, 10 Pages.

Zeinalipour-Yazti, et al., "MicroHash: An Efficient Index Structure for Flash-based Sensor Devices", In Proceedings of the Conference on File and Storage Technologies (FAST), vol. 5, Dec. 2005, 14 Pages.

Zhu, et al., "Avoiding the Disk Bottleneck in the Data Domain Deduplication File System", In Proceedings of the Conference on File and Storage Technologies, Feb. 26, 2008, 14 Pages.

Ziv, et al., "A Universal Algorithm for Sequential Data Compression", In Proceedings of the Transactions on Information Theory, vol. 23, Issue 3, May 1977, pp. 337-343.

Zukowski, et al., "Architecture-Conscious Hashing", In Proceedings of the 2nd International Workshop on Data Management on New Hardware, Jun. 25, 2006, 8 Pages.

"Notice of Allowance Issued in U.S. Appl. No. 12/773,859", Mailed Date: Nov. 5, 2012, 5 Pages.

"FIPS Pub180-1, Secure Hash Standard", Apr. 17, 1995, 18 Pages.

"Notice of Allowance Issued in U.S. Appl. No. 12/773,859", Mailed Date: Mar. 19, 2013, 8 Pages.

"Non-Final Office Action Issued in U.S. Appl. No. 12/773,859", Mailed Date: Jun. 13, 2012, 9 Pages.

Olson, et al., "Berkeley DB", In Proceedings of the FREENIX Track: 1999 USENIX Annual Technical Conference, Jun. 6, 1999, 10 Pages.

"International Search Report and Written Opinion Received for PCT Patent Application No. PCT/US2011/067544", Mailed Date: Jul. 31, 2012, 8 Pages.

"European Search Report Received for European Patent Application No. 11854263.8", Mailed Date: Dec. 23, 2014, 11 Pages.

"Final Office Action Issued in U.S. Appl. No. 12/979,644", Mailed Date: Dec. 3, 2014, 10 Pages.

"Final Office Action Issued in U.S. Appl. No. 12/979,644", Mailed Date: Mar. 21, 2013, 20 Pages.

"Final Office Action Issued in U.S. Appl. No. 12/979,644", Mailed Date: Jul. 31, 2014, 8 Pages.

"Non-Final Office Action Issued in U.S. Appl. No. 12/979,644", Mailed Date: Nov. 29, 2012, 15 Pages.

"Non-Final Office Action Issued in U.S. Appl. No. 12/979,644", Mailed Date: Mar. 26, 2014, 8 Pages.

"Final Office Action Received for U.S. Appl. No. 12/979,669", Mailed Date: Mar. 20, 2013, 21 Pages.

"Non-Final Office Action Received for U.S. Appl. No. 12/979,669", Mailed Date: Nov. 29, 2012, 18 Pages.

"Notice of Allowance Received for U.S. Appl. No. 12/979,669", Mailed Date: Mar. 31, 2014, 5 Pages.

"Notice of Allowance Received for U.S. Appl. No. 12/979,669", Mailed Date: Sep. 4, 2014, 6 Pages.

"Office Action Received for Chinese Patent Application No. 201110445284.1", Mailed Date: Sep. 5, 2014, 13 Pages.

"Office Action Received for Chinese Patent Application No. 201110445284.1", Mailed Date: Dec. 30, 2013, 12 Pages.

"International Search Report and Written Opinion Received for PCT Patent Application No. PCT/US2011/067292", Mailed Date: Jul. 30, 2012, 8 Pages.

"International Search Report and Written Opinion Received for PCT Patent Application No. PCT/US2011/067293", Mailed Date: Jul. 24, 2012, 9 Pages.

Ousterhout, John, "Beating the I/O Bottleneck: A Case for Log-Structured File Systems" In Proceedings of ACM SIGPOS Operating Systems Review, Jan. 3, 1989, 19 Pages.

"Ancestral Quest 12.1", Retrieved on: Sep. 23, 2010, Available at: http://genealogy-software-review.toptenreviews.com/ancestral-quest-software.html, 6 pages.

"BerkeleyDB", Retrieved on: Dec. 8, 2009, Available at: http://www.oracle.com/technology/products/berkeley-db/index.html, 2 pages.

"Class PersistentStore", Retrieved on: Dec. 8, 2009, Available at: http://www.blackberry.com/developers/docs/4.5.0api/net/rim/device/api/system/PersistentStore.html, 3 pages.

"Comparing Deduplication Approaches: Technology Considerations for Enterprise Environments", Retrieved on: Oct. 20, 2010, Available at: https://web.archive.org/web/20100412024409/http://www.busmanagement.com/article/Comparing-Deduplication-Approaches-Technology-Considerations-for-Enterprise-Environments/, 4 pages.

"Data Deduplication in Tivoli Storage Manager V6.2 and V6.1", Retrieved on: Oct. 20, 2010, Available at: http://www.ibm.com/developerworks/mydeveloperworks/wikis/home/wiki/Tivoli%20Storage%20Manager/page/Data%20deduplication%20in%20Tivoli%20Storage%20Manager%20V6.1?lang=en, 18 pages.

"EMC Corporation. EMC Centera: Content Addresses Storage System, DataSheet", Available at: http://web.archive.org/web/20081202043448/http://www.kofax.com/distribution/pdf/EMC_Centera_en.pdf, 4 pages.

Debnath, et al., "FlashStore: High Throughput Persistent Key-Value Store", In Proceedings of the VLDB Endowment, vol. 3, Issue 1-2, Sep. 1, 2010, pp. 1414-1425.

"Iometer", Retrieved on: Jun. 28, 2010, Available at: http://www.iometer.org/, 1 page.

"MurmurHash Function", Retrieved on: Dec. 8, 2009, Available at: http://en.wikipedia.org/wiki/MurmurHash, 2 pages.

"MySpace Uses Fusion Powered I/O to Drive Greener and Better Data Centers", Retrieved on: Dec. 8, 2009, Available at: http://web.archive.org/web/20091104032210/http://www.fusionio.com/case-studies/myspace-case-study.pdf, 6 pages.

"Samsung SSD", Retrieved on: Dec. 8, 2009, Available at: http://www.samsung.com/global/business/semiconductor/productinfo.do?fmly_id=161&partnum=MCCOE64G5MPP, 1 page.

"System.Threading Namespace", Retrieved on: Jun. 28, 2010, Available at: https://msdn.microsoft.com/en-us/library/system.threading.aspx, 5 pages.

"TPC: Transaction Processing Benchmark", Retrieved on: Dec. 8, 2009, Available at: http://www.tpc.org, 1 page.

"Xbox Live 1 vs 100 game", Retrieved at <<https://web.archive.org/web/20091221135217/http://www.xbox.com/en-us/games/1/1v100>> Published on: Dec. 21, 2009, 1 Page.

"Xbox Primetime", Retrieved on: Jun. 28, 2010, Available at: http://www.xboxprimetime.com/, 4 pages.

Agrawal, et al., "Design Tradeoffs for SSD Performance", In USENIX Annual Technical Conference on Annual Technical Conference, Jun. 22, 2008, 14 Pages.

Agrawal, et al., "Flash-Optimized Index Structures for Embedded Systems", In Proceedings of the VLDB Endowment, vol. 2, Issue 1, Aug. 2009, 14 Pages.

Anand, et al., "Building Cheap and Large CAMs Using BufferHash", In Technical Report TR1651, University of Wisconsin Madison, Feb. 2009, 15 Pages.

Anand, et al., "Cheap and Large CAMs for High Performance Data-Intensive Networked Systems", In Proceedings of the Conference on Networked Systems Design and Implementation, Apr. 28, 2010, 16 Pages.

(56) References Cited

OTHER PUBLICATIONS

Andersen, et al., "FAWN: A Fast Array of Wimpy Nodes", In Proceedings of the 22nd Symposium on Operating Systems Principles, Oct. 11, 2009, 17 Pages.
"Audio Slideshows—Human Interest Storytelling", Published on: Sep. 23, 2010, Available at: http://blogs.oregonstate.edu/instructionaldesign/2010/07/20/audio-slideshows-human-interest-storytelling/, 4 pages.
Askitis, Nikolas, "Fast and Compact Hash Tables for Integer Keys", In Proceedings of the Thirty-Second Australasian Conference on Computer Science, vol. 91, Jan. 2009, 10 Pages.
Azar, et al.,"Balanced Allocations", In SIAM Journal on Computing, vol. 29, Issue 1, Sep. 1, 1999, pp. 180-200.
Bentley, et al., "Personal vs. Commercial Content: The Similarities Between Consumer Use of Photos and Music", In Proceedings of the Conference on Human Factors in Computing Systems, Apr. 22, 2006, 10 Pages.
Bhagwat, et al., "Extreme Binning: Scalable, Parallel Deduplication for Chunk-based File Backup", In Proceedings of the 17th International Symposium on Modelling, Analysis and Simulation of Computer and Telecommunication Systems, Sep. 2009, 9 Pages.
Broder, et al., "Network Applications of Bloom Filters: A Survey", Internet Mathematics, vol. 1, Issue 4, 2003, pp. 485-509.
Caulfield, et al., "Gordon: Using Flash Memory to Build Fast, Power-Efficient Clusters for Data-Intensive Applications", In Proceeding of the 14th International Conference on Architectural Support for Programming Languages and Operating Systems, Mar. 7, 2009, 12 Pages.
Chen, Shimin "FlashLogging: Exploiting Flash Devices for Synchronous Logging Performance", In Proceedings of the International Conference on Management of Data, Jun. 29, 2009, 14 Pages.
Chen, et al., "Understanding Intrinsic Characteristics and System Implications of Flash Memory Based Solid State Drives", In Proceedings of the Performance Evaluation Review, vol. 37, Issue 1, Jun. 15, 2009, 12 Pages.
Clements, et al., "Decentralized Deduplication in SAN Cluster File Systems", In Proceedings of the Annual Technical Conference USENIX, Oct. 20, 2010, 23 Pages.
Myers, Daniel "On the use of NAND Flash Memory in High-Performance Relational Databases", A Thesis Submitted to the Massachusetts Institute of Technology in Partial Fulfillment of the Requirements for the Degree of Master of Degree in Computer Science and Engineering, Feb. 2008, pp. 1-49.
Debnath, et al., "ChunkStash: Speeding up Inline Storage Deduplication using Flash Memory", In Proceedings of the USENIX Annual Technical Conference, Jun. 2010, 16 Pages.
Decandia, "Dynamo: Amazon's Highly Available Key-value Store", In Proceedings of the Symposium on Operating Systems Principles, Oct. 14, 2007, pp. 205-220.
Dubnicki, et al., "HYDRAstor: A Scalable Secondary Storage", In Proceedings of the USENIX Conference on File and Storage Technologies, Feb. 2009, 14 Pages.

Narayanan, et al., "Migrating Server Storage to SSDs: Analysis of Tradeoffs", In Proceedings of the European Conference on Computer Systems, Apr. 1, 2009, pp. 145-158.
Eshghi, et al., "A Framework for Analyzing and Improving Content-Based Chunking Algorithms", In Technical Report TR 30 Hewlett-Packard Labs, Sep. 22, 2005, 11 Pages.
Fegreus, "Lab Review: Data deduplication for Real Tape", Published on: Jan. 22, 2010, Available at: http://www.infostor.com/index/articles/display/7052624306/articles/infostor/backup-and_recovery/archiving/2010/january-2010/1ab-review_data_deduplication.html, 6 pages.
Gal, et al., "Algorithms and Data Structures for Flash Memories", In ACM Computing Surveys (CSUR), vol. 37, Issue 2, Jun. 2005, pp. 138-163.
Gill, et al., "STOW: A Spatially and Temporally Optimized Write Caching Algorithm", In Proceedings of the 2009 Conference on USENIX Annual Technical Conference, Jun. 14, 2009, 14 Pages.
Gupta, et al., "DFTL: A Flash Translation Layer Employing Demand-Based Selective Caching of Page-Level Address Mappings", In Proceedings of the International Conference on Architectural Support for Programming Languages and Operating Systems, Mar. 7, 2009, 12 Pages.
Hamilton, James, "Perspectives", Published on: May 10, 2010, Available at: http://perspectives.mvdirona.com/2010/05/10/InterDatacenterReplicationGeoRedundancy.aspx, 5 pages.
Karl, "BerkeleyDB for .NET", Retrieved on: Dec. 8, 2009, Available at: http://sourceforge.net/projects/libdb-dotnet/, 1 page.
Kawaguchi, et al., "A Flash-Memory Based File System", In Proceedings of the USENIX Conference, Jan. 16, 1995, 10 Pages.
Kgil, et al., "Improving NAND Flash Based Disk Caches", In Proceedings of the International Symposium on Computer Architecture, Jun. 21, 2008, pp. 327-338.
Kim, et al., "BPLRU: A Buffer Management Scheme for Improving Random Writes in Flash Storage", In Proceedings of the FAST, vol. 8, Feb. 26, 2008, 14 Pages.
Koltsidas, et al., "Flashing Up the Storage Layer", In Proceedings of the VLDB Endowment, vol. 1, Issue 1, Aug. 1, 2008, 12 Pages.
Kruus, et al., "Bimodal Content Defined Chunking for Backup Streams", In Proceedings of the 8th USENIX conference on File and storage technologies, Feb. 23, 2010, 14 Pages.
"Fusion-10 Drive Datasheet", Published on: Aug. 23, 2009, Available at: https://web.archive.org/web/20090823195521/http://www.fusionio.com/PDFs/Data_Sheet_ioDrive_2.pdf, 1 page.
Lee, et al., "A Log Buffer-Based Flash Translation Layer Using Fully-Associate Sector Translation", In Proceedings of the Transactions on Embedded Computing Systems,vol. 6, Issue 3, Jul. 1, 2007, 29 Pages.
Lillibridge, et al., "Sparse Indexing: Large Scale, Inline Deduplication Using Sampling and Locality", In Proceedings of the 7th conference on File & Storage Technologies, vol. 9, Feb. 24, 2009, pp. 111-123.
"Non-Final Office Action received for U.S. Appl. No. 13/919,738", Mailed Date: Nov. 19, 2014, 13 Pages.
"Final Office Action Issued in U.S. Appl. No. 13/919,738", Mailed Date: Apr. 22, 2015, 13 Pages.

\* cited by examiner

FLASH MEMORY CACHE INCLUDING FOR USE WITH PERSISTENT KEY-VALUE STORE

BACKGROUND

Flash media has advantages over RAM and hard disk storage, namely that unlike RAM, flash media is persistent, and unlike hard disk, flash media provides much faster data access times, e.g., on the order of hundreds or thousands of times faster than hard disk access. Many applications thus may benefit from the use of flash media.

However, flash media is expensive, at present costing ten to twenty times more per gigabyte than hard disk storage. Further, flash devices are subject to reduced lifetimes due to page wearing, whereby small random writes (that also have relatively high latency) are not desirable. What is needed is a technology for using flash media that provides high performance, while factoring in cost considerations, efficiency and flash media lifetimes.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology by which a flash memory is configured into a secondary storage device (e.g., a flash store and/or a flash store and a disk-based device) via RAM-based data structures and mechanisms so as to maintain a cache of data items (e.g., key value pairs) in flash pages. A RAM-based index maps each data item in the flash store to the page in which that data item is maintained, and a RAM-based write buffer maintains data items to be written to the flash store. A mechanism (e.g., one or more threads) uses the RAM-based index to locate data items in the flash store, and to write data items from the RAM-based write buffer to the flash store. The write may occur when the data items fill a page, or when a coalesce time is reached.

In one aspect, the flash store serves as a cache between RAM and a hard disk store. The mechanism looks for a data item in a RAM-based read/write cache (e.g., comprising a RAM-based read cache and the RAM-based write buffer) before using the RAM-based index to locate data items in the flash store. A recycle mechanism makes a page in the flash store available by processing valid data items on the page, including destaging a data item from the page in the flash store to the hard disk store or reinserting the data item into the write buffer, based on whether the information indicates that the data item has been recently accessed. A data structure (e.g., a bloom filter pair is used to track (to a high probability) whether a data item has been recently accessed. Another data structure (a bloom filter) indicates to a high probability whether a data item has been destaged to the hard disk store.

In one aspect, the flash store is used in conjunction with RAM in a data deduplication system. The data items comprise chunk-identifier, metadata pairs, in which each chunk-identifier is representative of a hash of a chunk of data, which is used to determine whether that chunk is a duplicate of another chunk of data. The chunks are maintained in containers. If the chunk-identifier is in the flash store, chunks of a container corresponding to that chunk identifier are prefetched into the RAM cache. If the chunk identifier is not in the RAM cache, the RAM-based write-buffer, or the flash store, the chunk identifier is deemed to represent a new chunk, and the data of that chunk added to a container, with a chunk identifier, metadata pair for that chunk to the RAM-based write-buffer.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards using flash media as a cache between RAM and hard disk storage. In general, various data structures and mechanisms (e.g., algorithms) suitable for a given application allow data items such as key-value pairs to be efficiently looked up and/or inserted while stored on RAM or flash memory, in a manner that substantially reduces or avoids unnecessary hard disk access. One example implementation described herein maintains key-value pairs and provides efficient key lookup and insert operations, including based upon predetermined tradeoffs between performance and cost. Another example implementation provides an efficient and cost effective system for facilitating data deduplication operations.

It should be understood that any of the examples herein are non-limiting. Indeed, the technology described herein applies to any type of non-volatile storage that is faster than disk access, not only the flash media described herein. Moreover, the data structures described herein are only examples of ways to use a cache according to the technology described herein. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used in various ways that provide benefits and advantages in computing and data retrieval in general.

Figure 1:
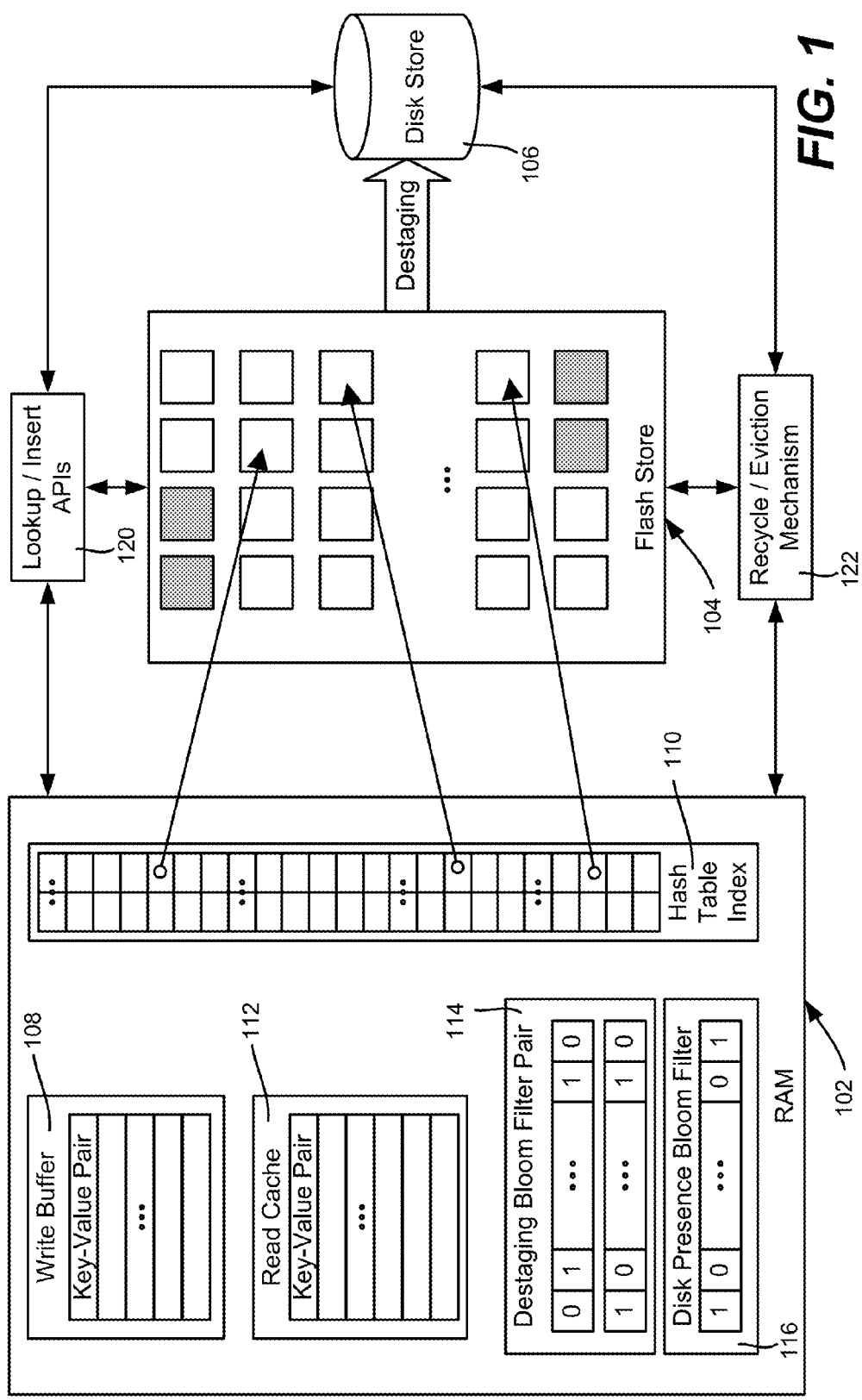
FIG. 1 is a block diagram representing an example architecture and data structures for using flash media as a cache between RAM and hard drive storage.

FIG. 1 shows example architectural components of one implementation of a key-value store maintained among relatively very fast RAM 102, relatively fast non-volatile storage ("flash store" 104) and a relatively slow hard disk data store 106. The hard disk data store 106 is in general significantly slower with respect to data access than the flash store 104, and may be maintained on any suitable hard disk device, whether local or remote, and regardless of how many hard disks and/or other mechanisms make up the hard disk device.

A RAM write buffer 108 comprising a data structure (e.g., of fixed-size) maintained in the RAM 102 buffers data item writes such that a write is made to the flash store 104 only in a controlled manner, e.g., when there is enough data to fill a flash page (which is typically 2 KB or 4 KB in size, and is known in advance). As used in the example of FIG. 1 and for purposes of the example description herein, the data items comprise key-value pairs, however any suitable data item may be used with the technology described herein.

The flash store 104 provides persistent storage for the key-value pairs and may be organized as a recycled append log, in which the pages on flash are maintained implicitly as a circular linked list. Because the flash translation layer (FTL) translates logical page numbers to physical ones, it is straightforward to implement the circular linked list as a contiguous block of logical page addresses with wrap-around. This may be realized by two page number variables, one for the first valid page (oldest written) and the other for the last valid page (most recently written). Note that FIG. 1 represents valid pages (containing maintained data) as non-shaded, and invalid pages (available for use) as shaded. In one implementation, each flash page begins with a header portion that contains metadata information including the time when the page was written, the number of key-value pairs in the page, and the beginning offset for each.

In one implementation, the key-value pairs are written to flash in units of a page size containing a set of pairs. Each key-value entry in the flash store 104 also has an associated write operation timestamp. To achieve desired persistency considerations, writes to flash 104 also may be made when a pre-specified coalesce time interval is reached, as described below. In general, the RAM write buffer is sized two to three times the flash page size so that key-value writes can still occur when another part of the RAM write buffer 108 is being written to flash 106.

In one implementation, a RAM hash table index 110 provides an index structure for locating the key-value pairs stored on the flash store 104. The hash table index 110 is maintained in RAM and is organized as a hash table having pointers to the full key-value pairs stored on the flash store 104, with a general goal of one flash read per lookup. As described below, there is provided a mechanism for resolving collisions, which in one implementation is based upon a variant of cuckoo hashing. Also described is storing compact key signatures in memory, which allows balancing between RAM usage versus false flash reads.

Another aspect is directed towards destaging recently unused key-value pairs from the flash store 104 to the hard disk store 106, such as when RAM or flash bottlenecks are reached, to eliminate the need for rehashing. To this end, a RAM read cache 112 (e.g., of fixed-size) provides a read cache of recently read items that is maintained in RAM. A least recently used policy (or other suitable mechanism) evicts key-value pairs when inserting items into a full cache.

Also shown in FIG. 1 is a pair of destaging bloom filters 114 (or other suitable data structure), which is used by a flash recycling thread as described below to determine to a high probability whether a valid key-value pair on flash has been recently accessed. As is known, a bloom filter is a probabilistic data structure in which false positives are possible, which are acceptable in this usage scenario. If determined to be recently accessed, a key-value pair is reinserted into the RAM write buffer 108, (where it will be written back to the flash store 104), otherwise the pair is destaged to the hard disk store 106. A disk-presence bloom filter 116 (or other suitable data structure) is used to record the keys that are destaged to the hard disk store 106, as also described below. This (to a high probability) avoids looking up non-existent keys, and thereby avoids hard disk access latencies.

Various real-world applications may use this flash-based technology as an underlying persistent key-value store. For example, online multi-player gaming technology allows people from geographically diverse regions to participate in the same game. The number of concurrent players in such a game may range from tens to hundreds of thousands, and the number of concurrent game instances offered by a single online service may range from tens to hundreds. Key-value pairs are thus used in such an online multi-player gaming application, with high throughput and low latency being desirable for the get-set key operations. At the same time, persistency is desirable for purposes of resuming a game from an interrupted state if and when crashes occur, for offline analysis of game popularity, progression, and dynamics with the objective of improving the game, and/or verification of player actions for fairness when outcomes are associated with monetary rewards. The flash-based technology described herein meets these needs.

Figure 2:
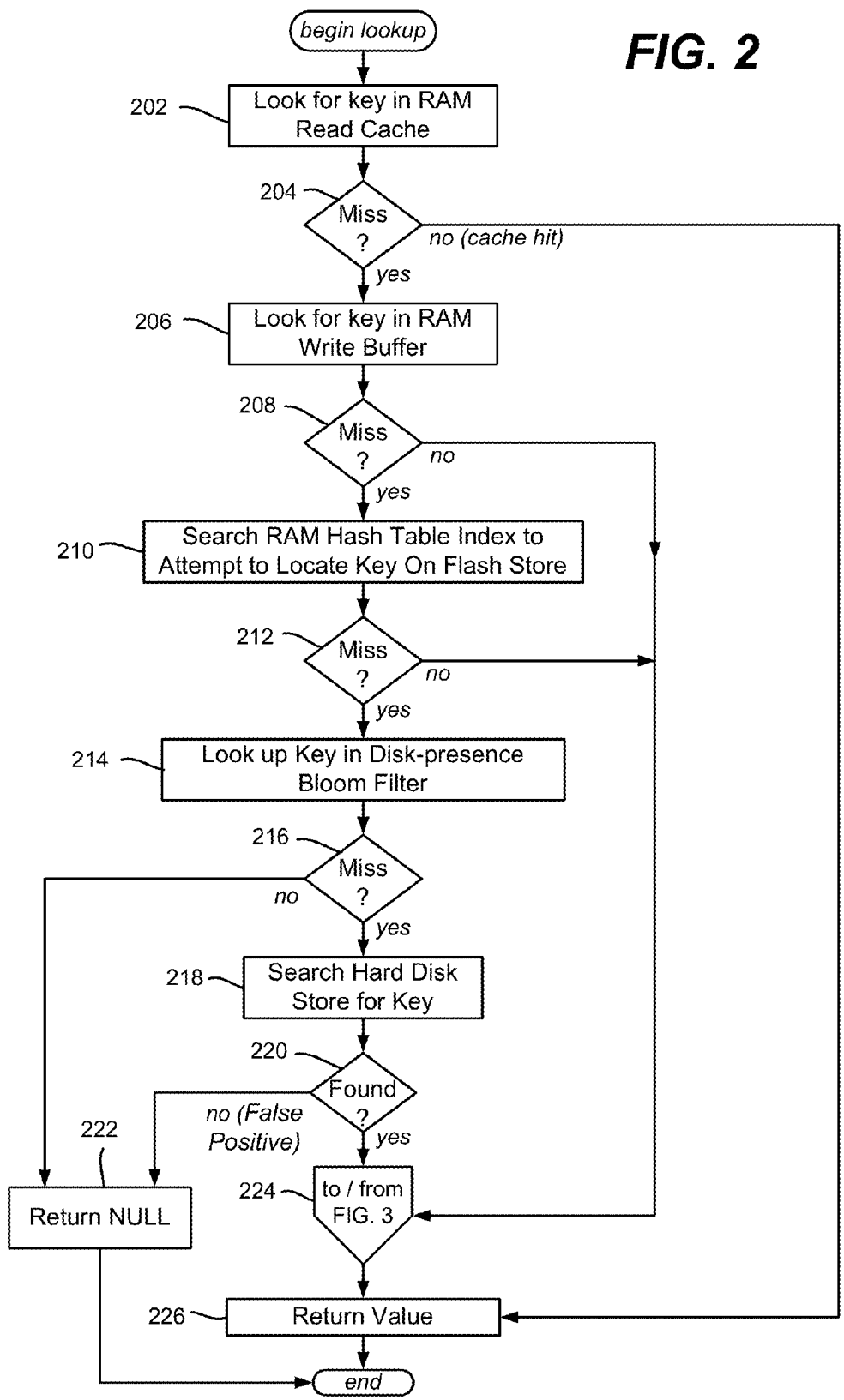
FIGS. 2 and 3 comprise a flow diagram representing example steps for looking up a key of a key-value pair in RAM, flash memory or a hard drive as needed.
Figure 3:
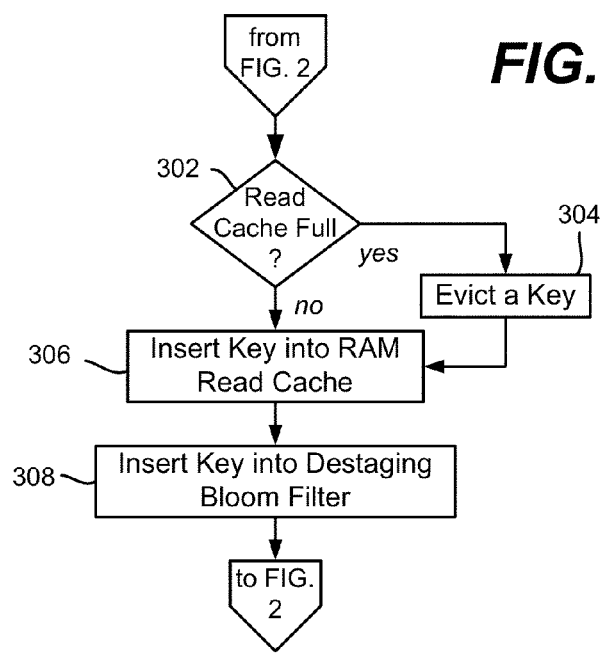
Figure 4:
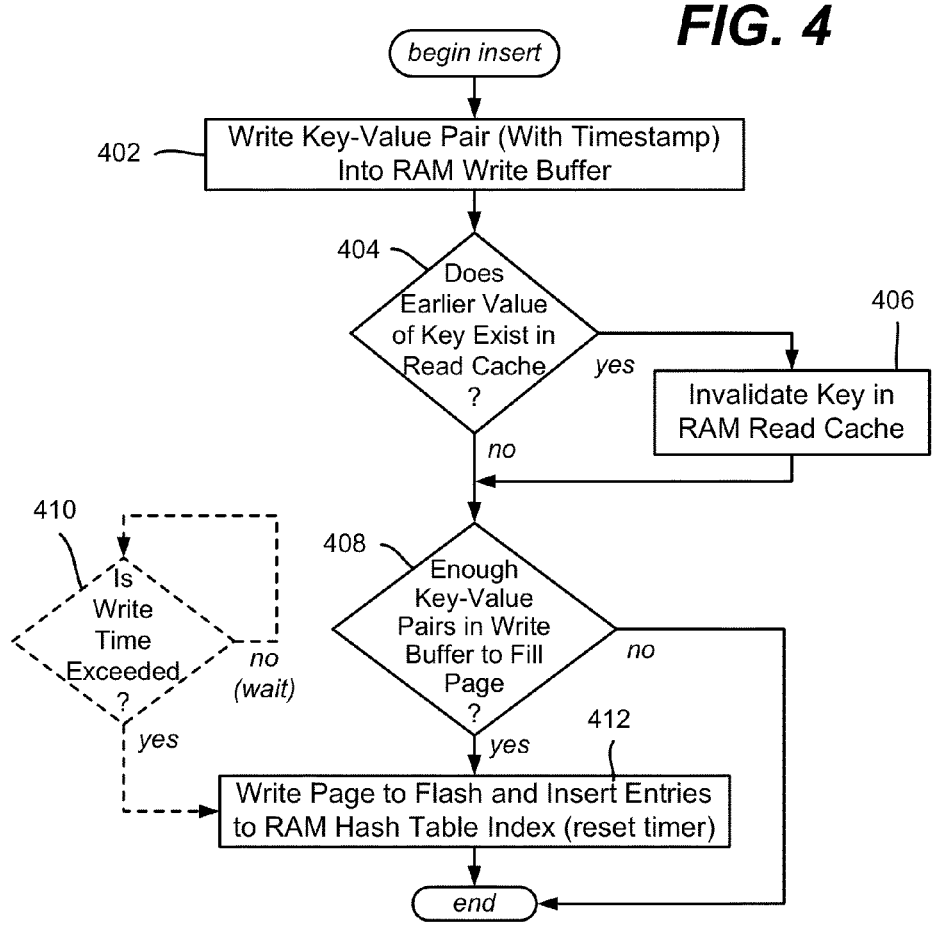
FIG. 4 is a flow diagram representing example steps for handling insertion of a key into a flash-based architecture.

FIGS. 2-4 are example block/flow diagrams explaining the sequence of accesses in key lookup and insert operations, e.g., via client-called APIs 120 (FIG. 1), given the hierarchical relationship of the different storage areas. As represented in FIG. 2, a key lookup operation (get) first looks for a key in the RAM read cache 112 (step 202). Step 204 evaluates the cache hit or miss; if there is a cache hit (step 204), the process branches ahead to step 224 to return the associated value. If there is a miss, the process continues to step 206.

Step 206 looks for the key in the RAM write buffer 108. Upon a miss (step 208), the process searches the RAM hash table index 110 at step 210 in an attempt to locate the key on the flash store 104. Upon a miss (step 212), step 214 looks up the key in the disk-presence bloom filter 116. If the key is not present, step 216 branches to step 222 to return null. Otherwise, step 218 searches the hard disk store 106 for the key, where it is ordinarily present as indicated by the disk-presence bloom filter 116. However, if the key is not found, (e.g., the bloom filter returned a false positive), step 220 branches to step 222 to return null.

As represented by step 224 and FIG. 3, if the key is found at any place other than the RAM read cache, the key-value pair is inserted into the RAM read cache (step 306). Note that via steps 302 and 304, if the read cache is full a suitable key (e.g., the least recently used) is evicted. At step 308, data representing the key is also inserted into the destaging bloom filter 114 to indicate that it has been recently accessed, as described below. Step 226 of FIG. 2 returns the value.

Turning to a key insert (update/set) operation as represented in FIG. 4, step 402 writes the key-value pair (together with its timestamp) into the RAM write buffer 108. If an earlier value of the key exists in the RAM read cache 112, as evaluated by step 404, it will be invalidated at step 406.

As represented by step 408, when there are enough key-value pairs in RAM write buffer to fill a flash page, a page of these entries is written to flash and inserted to the RAM hash table index at step 412. Also shown in FIG. 4 is (optional step 410) is writing the write buffer to flash when a coalesce time interval threshold is met, that is, when less than a page exists. Note that such timed writing is likely event driven and performed by a separate process (or thread), but is shown in FIG. 4 for completeness. Such a timed writing to the flash store 104 provides for persistency by ensuring that any key written to RAM is persisted within the coalesce time, to handle situations in which few keys are being written and thus the page does not fill rapidly enough. The coalesce time may be configurable.

In a typical usage scenario, eventually the pages in flash store 104 will begin to fill up. When this occurs, e.g., when flash usage exceeds a certain threshold, (e.g., eighty percent) any previously used, valid keys are maintained as described below and the page evicted/recycled for use. Recycling may also be based on the RAM hash table index usage; for example, when the hash table index 110 exceeds a target maximum load factor (e.g., ninety percent), recycling may be performed to bring the usage below this threshold. In such a scenario, the flash store 104 serves as a cache for the much larger hard disk store 106. Different recycling operations may be applied to determine which keys and values are stored in the flash store 104, and which keys and values are destaged to the hard disk store 106.

One recycling operation considers currently used flash pages in oldest first order. On each page, the key-value pairs are scanned to determine whether they are valid or not. A key-value pair on a flash page is invalid (or, orphaned) if the record in the hash table index 110 for that key does not point to this entry on this flash page, which happens when a later write to the key happened.

Another recycling policy is the least recent used (LRU) policy. In such a case, each key-value pair has a flag, which is updated every time the key-value pair has been accessed. When the flash store 104 or the RAM index reaches a desired occupancy level, least recent used (LRU) key-value pairs are destaged to the hard disk store 106.

yet another recycling policy is the first in first out (FIFO) policy. In this case, the first key-value pair that was written to the flash store 104 is evicted when the flash store 104 or the RAM index reaches a desired occupancy level. FIFO is simpler to implement compared with LRU, but is less accurate in retaining the working set in the flash store 104.

As described above and in general, the pages on the flash store 104 are used in a circular linked list order, and the oldest pages are evicted/recycled after determining how to handle the valid key-value pairs of each such page. To this end, a recycle/eviction mechanism 122 (algorithm), generally represented in the flow diagram of FIG. 5, processes valid keys either by reinserting them into the flash store 104 (by reinserting the key-value pair into the RAM write buffer 108 where they will be later paged to the flash store 104) or by destaging them to the hard disk store 106.

Figure 5:
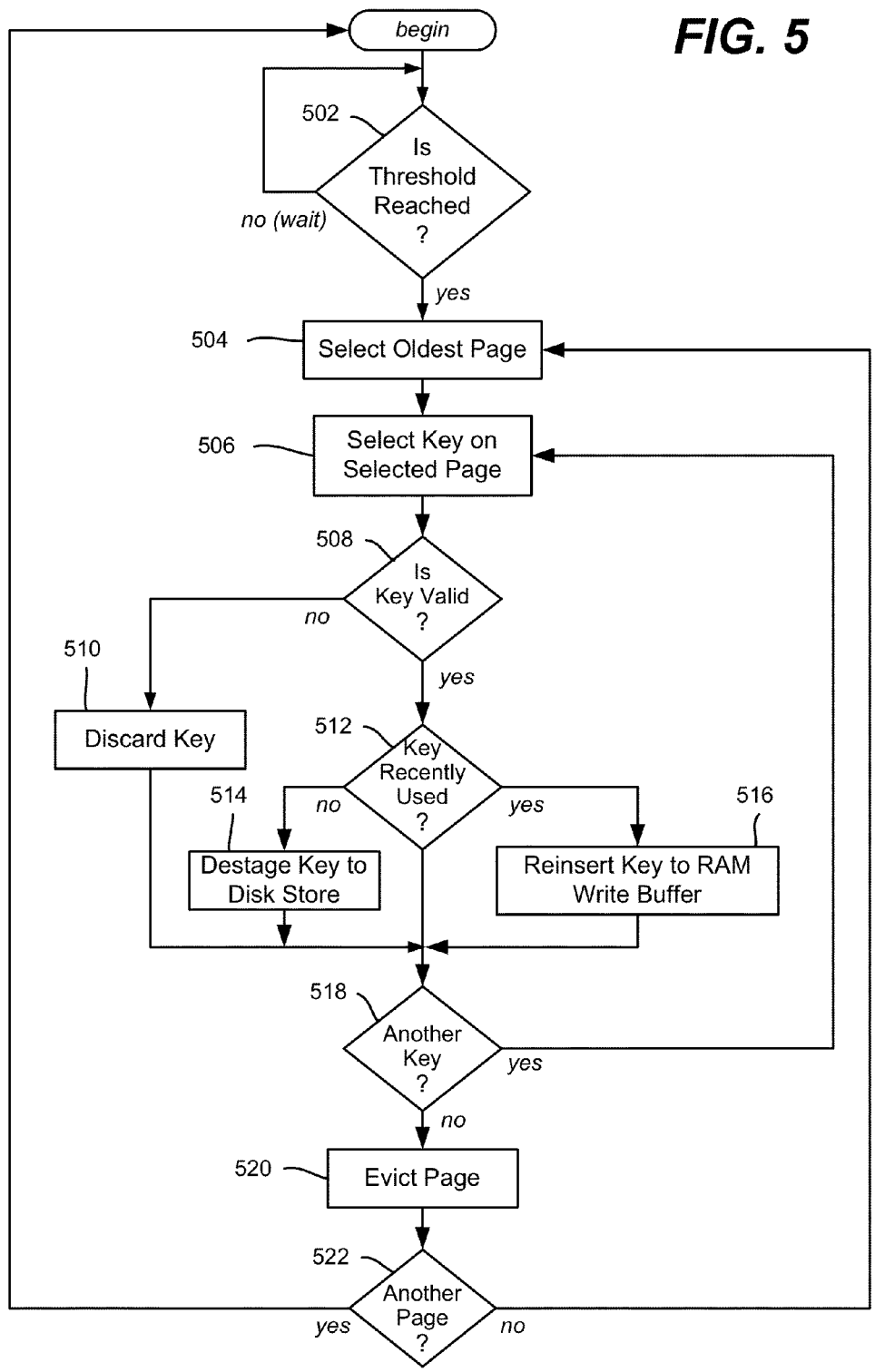
FIG. 5 is a flow diagram representing example steps for recycling pages of flash when pages are needed for storage.

In the example of FIG. 5, when the flash store 104 and/or hash table index 110 reaches a threshold usage level as determined via step 502, step 504 finds a page (e.g., the oldest) for recycling/eviction. Steps 506 and 518 selects the keys for processing, generally by discarding any invalid key (steps 508 and 510), or otherwise destaging each key (step 514) to the hard disk store 106 or reinserting each key into the write buffer (step 516), depending on the key's access pattern, as maintained in the destaging bloom filter pair 114 as evaluated by step 512. Again, note that a false positive is acceptable, because no data is lost, and at worst a key-value pair that was not recently accessed is handled as if it was recently accessed. Note that for keys destaged to the hard disk store 106, a small number of bits per entry may be stored and maintained in the hash table index 110 as described below.

In one implementation, the access pattern is maintained in a rotating pair of destaging bloom filters 114 (FIG. 1) in the RAM 102 that interchange between themselves as the currently used one. Each bloom filter is dimensioned to record the last b recently accessed unique keys, where b is a parameter that determines the amount of access history that is maintained (chosen to be larger than the cardinality of the current working set of key-value pairs; known methods for estimating working set size may be used). The current bloom filter and a counter are each initialized to zero. When a key is accessed, the key is inserted into the current bloom filter and the counter incremented if the key was not already in the bloom filter. Upon hitting the value of b unique accesses associated with the current bloom filter, the counter is reset to zero and usage switches to the other bloom filter (after reinitializing it). During the flash recycling operation, the flash recycling thread checks both bloom filters in RAM to determine the access pattern. The false positive property of a bloom filter makes the eviction policy more conservative, that is, if the presence of a key in the bloom filter is a false positive event, then that key is retained in the flash store 104 (by way of the write buffer 108) even though it was not actually accessed recently, although it may be destaged in subsequent flash recycling iterations.

Once the keys of a page have been processed in this way, step 520 evicts the page from the flash store 104, whereby it is again available (recycled) for use in the circular list, that is, the first page number variable is incremented. As represented by step 522, this eviction/recycling operation may be done until the threshold is met, or may be done for multiple pages to drop some percentage (e.g., ten percent) below the threshold, e.g., when the flash store threshold usage level is reached, process N pages so that the threshold is not met every time a single page is written.

The hard disk store 106 thus serves to store the key-value pairs that have been evicted from the flash store 104 because of page recycling. Because key lookups can miss in RAM and flash, the hard disk store 106 may be indexed to provide efficient access to the keys stored therein. In one implementation, a known embedded key-value database is used for indexing.

In addition to the insert and lookup operations, the write-time ordered log based storage organization in the flash store supports queries for retrieving the keys that have been modified since a given time t. To process such a query, the system locates the earliest flash page written at a time equal to or later than t, and scans the keys in the pages starting from that up to the last valid page in logical page number order. Keys having a write timestamp less than t are discarded from the results; note that they may appear in these pages because of being reinserted as a result of page recycling.

Turning to additional details of the hash table index 110, the hash table index 110 is structured as an array of slots. In one implementation, hash collisions, in which multiple keys map to the same hash table index slot, are resolved using a variant of cuckoo hashing. To this end, cuckoo hashing provides flexibility for each key to be in one of $n \geq 2$ positions; this keeps the linear probing chain sequence upper bounded at n. Note that cuckoo hashing increases hash table load factors while keeping lookup time bounded to a constant.

In the variant of cuckoo hashing used in the example implementation, n random hash functions $h_1, h_2; \ldots h_n$ are used to obtain n candidate positions for a given key x. These candidate position indices for key x are obtained from the lower-order bit values of $h_1(x), h_2(x); \ldots h_n(x)$ corresponding to a modulo operation.

During insertion, the key is inserted in the first available candidate slot. When all slots for a given key x are occupied during insertion, (e.g., by keys $y_1, y_2; \ldots y_n$), room can be made for key x by relocating keys $y_1$ in these occupied slots, because each key $y_i$ may be placed in a choice of (n−1) other locations. Note that in the original cuckoo hashing scheme, a recursive strategy is used to relocate one of the keys $y_i$; however in a worst case, this strategy may take many key relocations or get into an infinite loop, the probability for which can be shown to be very small and decreasing exponentially in n. In the variant described herein, the process attempts a small number of key relocations, after which if unsuccessful, the process makes room by picking a key to destage to the hard disk store 106. In practice, by dimensioning the hash table index 110 for a certain load factor and by choosing a suitable value of n, such events can be made extremely rare.

In an optimization, the amount of RAM usage per slot may be reduced by storing compact key signatures. Note that conventional hash table designs store the respective key in each entry of the hash table index. Depending on the application, the key size may range from few tens of bytes (e.g., 20-byte SHA-1 hash) to hundreds of bytes or more. Given that RAM size is limited (on the order of gigabytes), if the full key is stored in each entry of the RAM hash table index, this may cause a bottleneck with respect to the maximum number of entries in the hash table index before the flash storage capacity bounds are reached. Conversely, if a key is not stored in the in the hash table index 110, the search operation on the hash table index 110 needs to follow hash table index pointers to the flash store 104 to determine whether the key stored in that slot matches the search key. This may lead to relatively many false flash reads, which are expensive, as flash access speeds are two to three orders of magnitude slower than that of RAM.

To approach maximizing hash table index capacity (the number of entries) while minimizing false flash reads, one implementation stores a compact key signature (on the order of a few bytes, e.g., two bytes) in each entry of the hash table index 110. This signature is derived from both the key and the candidate position number at which the key is stored. When a key x is stored in its candidate position number i, the signature in the respective hash table index slot is derived from the higher order bits of the hash value $h_i(x)$. During a search operation, when a key y is looked up in its candidate slot number j, the respective signature is computed from $h_j(y))$ and compared with the signature stored in that slot. Only if a match happens is the pointer to the flash store followed to check if the full key matches. The percentage of false reads is relatively low.

Key-value pairs may be organized in the flash store 104 in a log-structure in the order of the respective write operations coming into the system. As described above, the hash table index 110 contains pointers to the key-value pairs stored in the flash store 104. One implementation uses a four-byte pointer, which is a combination of a page pointer and a page offset. By way of example, consider a 160 GB flash store with 4 KB pages, which is representative of contemporary devices. In this example, a page number may be specified with $\log_2(160 \text{ GB}/4 \text{ KB})=26$ bits. The remaining six bits can be used for the in-page offset, which point to 128 B boundaries in a 4 KB page; the stored key-value pairs are thus aligned at 128 B boundaries. Note that a pointer having a value of all ones (binary) is used to indicate an empty hash table index slot.

The flash store 104 may designed to maximize the RAM hash table index capacity because this determines the number of key-value pairs stored in the flash store 104 that can be accessed with one flash read. The RAM size for the hash table index 110 may be determined based upon the application requirements. For example, with a two-byte compact key signature and four-byte flash pointer per entry, a typical RAM usage of 4 GB for the hash table index 110 index accommodates a maximum of about 715 million entries. Whether RAM or flash capacity becomes the bottleneck for storing the working set of keys on flash depends on the key-value pair size. With 64-byte key-value pairs, 715 million entries in the hash table index occupy 42 GB on flash, which is easily accommodated in contemporary flash devices. With multiple flash devices, additional RAM may be provided to fully utilize them. Conversely, with 1024-byte key-value pairs, the 715 million entries in the hash table index 110 need 672 GB of flash, whereby multiple flash devices given contemporary flash device sizes.

Note that the functionalities of key lookup/insert operations, writing key-value pairs to the flash store 104 and updating the RAM hash table index, and/or recycling of flash pages (including reinserting/destaging key-value pairs) may be handled by separate threads in a multi-threaded architecture, as described below. Concurrency issues with shared data structures may arise in a multi-threaded design, and may be handled as also described below.

More particularly, to attempt to maximize throughput of key lookup and insert operations, the flash store mechanisms may be multi-threaded, with logical partitioning of system functionality across different threads. For example, one or more client serving threads may perform the key lookup/insert operations received from the client. For a write operation, the client serving thread is responsible for adding the key-value pair to the RAM write buffer; if the key already exists in the RAM read cache, it invalidates that entry. A flash writing thread writes the key-value pairs to the flash store, and removes these entries from the RAM write buffer. A flash recycling thread performs the recycling and destaging/reinsertion operations. One or more hard disk store management thread(s) may be used, e.g., the known "Berkeley DB" for disk store management has a multi-threaded architecture that provides an embedded key-value database that may be used to store and index the destaged key-value pairs.

Concurrency issues with shared data structures arise in the multi-threaded design, which are handled through thread synchronization using locks. So that a thread does not block unless it needs to, locks may be employed at suitable levels of granularity, that is, for correct concurrent execution and to avoid busy waiting. The following table summarizes the type of access (read or write) that different threads need on each shared data structure and the type of lock with which it is protected:

| Data Structure | Accessing Threads | Access Type | Lock Type |
|---|---|---|---|
| RAM write buffer | Client Serving Threads<br>Flash Writing Thread | Read/Write<br>Read/Write<br>Write | Producer-Consumer-Reader |

| Data Structure | Accessing Threads | Access Type | Lock Type |
|---|---|---|---|
| RAM hash table index | Client Serving Threads | Read Read/Write Read/Write | Reader-Writer |
| RAM read cache | Flash Writing Thread | Read/Write | Reader-Writer |
| RAM Bloom filters | Client Serving Threads Flash Recycling Thread | Read/Write Read/Write | Reader-Writer |

The RAM read cache 112 is accessed by the client serving threads. As described above, a thread executing a key lookup operation reads the cache and upon a miss, inserts the current key-value pair (read from elsewhere) after evicting another key-value pair (if the read cache was full). The RAM write buffer 108 has key-value pairs added to it by client serving threads and flash recycling thread; any such thread needs to block if the buffer is full. Also, the flash writing thread needs to block until the key-value pairs in the buffer are confirmed written to a flash page. Thus, the client serving/flash recycling threads and the flash writing thread have a producer-consumer relationship on the RAM write buffer. Moreover, the client serving threads also need to read the buffer upon a miss in the RAM read cache during a read key operation. Thus, the RAM write buffer needs to be protected by a combination of producer-consumer and reader-writer locks. Known synchronization techniques used separately for each of them are adapted to obtain a combined lock of the desired nature, referred to herein as a producer-consumer-reader lock.

The RAM hash table index 110 is read by the client serving threads during a read key operation and read/written by the flash writing and flash recycling threads, and thus is served by a reader-writer lock. However, to maximize the number of concurrent operations on the hash table index, it may be necessary to lock the hash table index 110 at the level of each entry, which if performed creates significant overhead associated with maintenance of so many locks. Conversely, using only one lock for the entire hash table index 110 minimizes the number of concurrent operations allowed leading to unnecessary blocking of threads. In one implementation, a balance is provided by letting the hash table index have N slots, and partitioning the hash table index into m segments, with each segment having N/m contiguous slots; segment level locks are then used. When a thread needs to access slot i of the hash table index, the thread obtains the appropriate type of lock (read or write) on segment number [i/m]. Under this design, two threads that need to respectively read and write different slots in the same segment need to compete for the same segment lock; thus the design compromises on maximum allowable concurrency to reduce the overhead from the number of locks.

Another aspect is that the persistency guarantee enables the flash-based system to recover from system crashes, e.g., due to power failure or other reasons. Because the system logs the key-value write operations to flash, it is straightforward to rebuild the hash table index in RAM by scanning the valid flash pages on flash. Recovery using this method can take some time, however, depending on the total size of valid flash pages that need to be scanned and the read throughput of the flash memory. If crash recovery needs to be executed faster so as to support "near" real-time recovery, then the RAM hash table index may be occasionally/periodically checkpointed into flash (in a separate area from the key-value pair logs). For example, the recycling process treats the content stored in the secondary storage device (flash store) as a stream, and for each key-value pair in the flash store, checks if it is pointed by a pointer in the RAM-index. If pointed to, the key-value pair is copied into a new stream, and garbage collection is performed on at least a portion of a previous stream. The RAM index is periodically checkedpointed into a storage device in association with a current end position of the key-value store stream for use in crash recovery.

Recovery then involves reading the last written hash table index checkpoint from flash and scanning key-value pair logged flash pages with timestamps after the checkpoint to and inserting them into the restored hash table index. During the operation of checkpointing the hash table index, the insert operations need to be suspended (although read operations by other threads may continue). The flash writing thread can continue with flash writing operations during this time but cannot insert items into the hash table index. A temporary, small in-RAM hash table may be used to provide an index for the interim items. After the checkpointing operation completes, any key-value pairs from the flash pages written in the interim are inserted into the hash table index. Key lookup operations, upon missing in the hash table index, check in these flash pages (via the small additional hash table) until the latter insertions into the hash table index are complete. The flash recycling thread is suspended during the hash table index checkpointing operation, since the recycling thread cannot set hash table index entries to null.

Note that by using known concepts, the flash store may be extended to multiple nodes. For example, one approach may use a one-hop distributed hash table (DHT) based on consistent hashing to map the key space across multiple nodes. An alternative approach is to use hash function-based partitioning of keys across nodes, with each node protected by buddy pair machines; note however that new nodes cannot be added easily, because a hash function does not have the locality preserving redistribution properties of consistent hashing.

Turning to another aspect, storage deduplication refers to identifying duplicate data using disk-based indexes on chunk hashes, which has a number of benefits in computing including using inline deduplication to provide high backup throughput. However, storage deduplication can create throughput bottlenecks due to the disk I/Os involved in index lookups. While known RAM prefetching and bloom filter based techniques help avoid disk I/Os on a high percentage (e.g., close to ninety-nine percent) of the index lookups, even at this reduced rate the index lookups that do go to disk cause potential problems.

The technology described herein is able to reduce the penalty of index lookup misses in RAM typically by orders of magnitude, namely by serving such lookups from a flash memory-based index and thereby increasing inline deduplication throughput. The use of flash memory as described herein is able to reduce the significant gap between RAM and hard disk in terms of both cost and access times.

Figure 6:
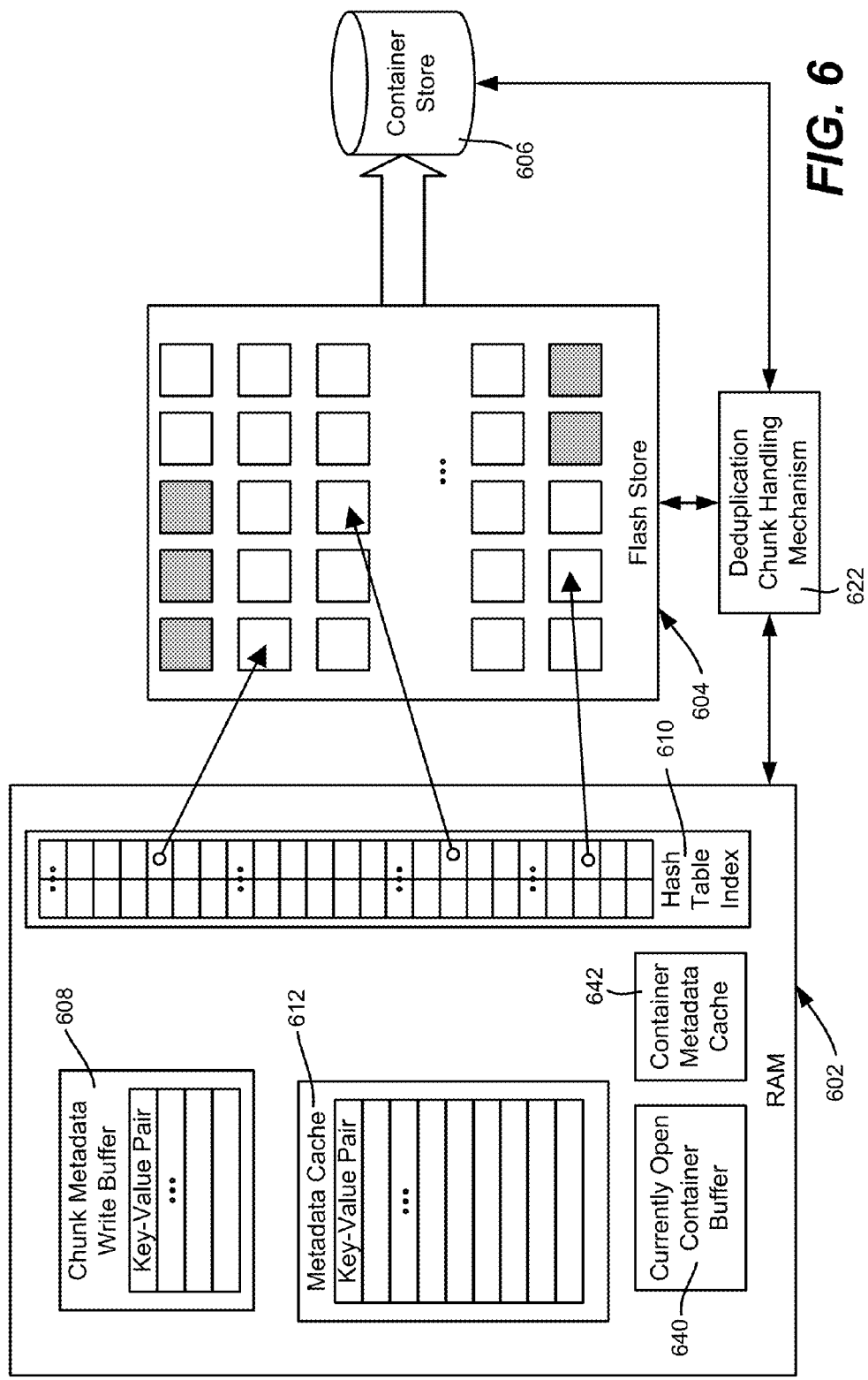
FIG. 6 is a block diagram representing an example architecture and data structures for a deduplication system that uses flash media as a cache between RAM and hard drive storage.

To this end, as generally represented in FIG. 6, a flash-based inline deduplication system using a chunk metadata store on a flash store 604 is provided. In one implementation, the system uses one flash read per chunk lookup and works with RAM prefetching strategies.

In general, and similar to the above-described flash based key-value system, the deduplication system organizes chunk metadata in a log-structure on the flash store 604 to exploit fast sequential writes, while using an in-memory hash table index 610 to index them, with hash collisions resolved by the above-described variant of cuckoo hashing. Also similar to as described above, the in-memory hash table index 610 may store compact key signatures instead of full chunk hashes so as to balance tradeoffs between RAM usage and false flash reads. Further, by indexing a small fraction of chunks per container, the system can reduce RAM usage significantly with negligible loss in deduplication quality. One implementation of the system can index 6 TB of unique (deduplicated) data using 45 GB of flash.

In one implementation, data chunks coming into the system are identified by their SHA-1 hash, and, via a deduplication chunk handling mechanism 622 (described below with reference to FIG. 7), are looked up in an index of currently existing chunks in the system (for that storage location or stream). If a match is found, the metadata for the file (or object) containing that chunk is updated to point to the location of the existing chunk. If there is no match, the new chunk is stored in the system and the metadata for the associated file is updated to point to it. One implementation allocates 44 bytes for the metadata portion, with the 20-byte chunk hash comprising the key and the 44-byte metadata being the value, for a total key-value pair size of 64 bytes.

Rabin fingerprinting-based sliding window hash may be used on the data stream to identify chunk boundaries in a content-dependent manner. A chunk boundary is declared when the lower order bits of the Rabin fingerprint match a certain pattern. The length of the pattern can be adjusted to vary the average chunk size. The average chunk size in one system is 8 KB; Ziv-Lempel compression on individual chunks can achieve an average compression ratio of two to one, so that the size of the stored chunks on hard disk averages around 4 KB. The SHA-1 hash of a chunk serves as its chunk-id in the system described herein.

The system may target complete deduplication and ensure that no duplicate chunks exist in the system after deduplication. However, a technique for RAM usage reduction that comes at the expense of marginal loss in deduplication quality may be provided.

A container store 606 on a hard disk manages the storage of chunks. In one implementation, each container stores at most 1024 chunks and averages in size around 4 MB. As new (non-duplicate) chunks come into the system, they are appended to a current container 640 buffered in RAM 602. When the current container 640 reaches a target size of 1024 chunks, it is sealed and written to hard disk and a new (empty) container is opened for future use.

A RAM chunk metadata write buffer 608 (e.g., of fixed size) buffers the chunk metadata information for the currently open container 640. The buffer is written to flash when the current container is sealed, e.g., the buffer accumulates 1024 chunk entries and reaches a size of 64 KB. The RAM write buffer 612 is sized to two-to-three times the flash page size so that chunk metadata writes can still go through when part of the buffer is being written to flash.

To eliminate hard disk accesses for chunk-id lookup, the flash store 604 maintains metadata for chunks maintained in the system, indexed with the RAM hash table index 610. A cache 612 for chunk metadata is also maintained in the RAM 602. The fetch (prefetch) and eviction policies may be executed at the container level (i.e., metadata for all chunks in a container).

To implement such a container level prefetch and eviction policy, a RAM container metadata cache 642 (e.g., fixed-size) for the chunk metadata may be maintained for the containers whose chunk metadata is currently held in RAM; this cache 642 maps a container-id to the chunk-ids it contains. In one implementation, the size of this container cache 642 determines the size of the chunk metadata cache, as a container has 1024 chunks. For a RAM chunk metadata cache eviction strategy, the container metadata cache 642 in RAM may follow a least recently used (LRU) replacement policy. When a container is evicted from this cache, its containing chunk-ids are removed from the chunk metadata cache 612. Note that the deduplication system does not need to use bloom filters to avoid hard disk lookups for non-existent chunks.

With respect to a prefetching strategy, the predictability of sequential chunk-id lookups during second and subsequent full backups may be used in a known manner. Because datasets do not change much across two backups, duplicate chunks in a current full backup are very likely to appear in the same order as they did in the previous backup. As a result, when the metadata for a chunk is fetched from flash (upon a miss in the chunk metadata cache 612 in RAM 602), the system prefetches the metadata for the chunks in that container into the chunk metadata cache 612 in RAM and adds the associated container's entry to the RAM container metadata cache 642. Because of this prefetching strategy, it is generally likely that the next several hundreds or thousands of chunk lookups will hit in the RAM chunk metadata cache 612.

In one implementation, the chunk metadata storage is organized on flash into logical page units of 64 KB, which corresponds to the metadata for the chunks in a single container (1024 chunks at 64 bytes per chunk-id and metadata). The RAM hash table index is generally similar to that described above, as the index maintains pointers to the pairs (of chunk-id, metadata) stored on the flash store 604. As described above, collisions may be resolved using a variant of cuckoo hashing, while compact key signatures may be maintained in memory to tradeoff between RAM usage and false flash reads.

Figure 7:
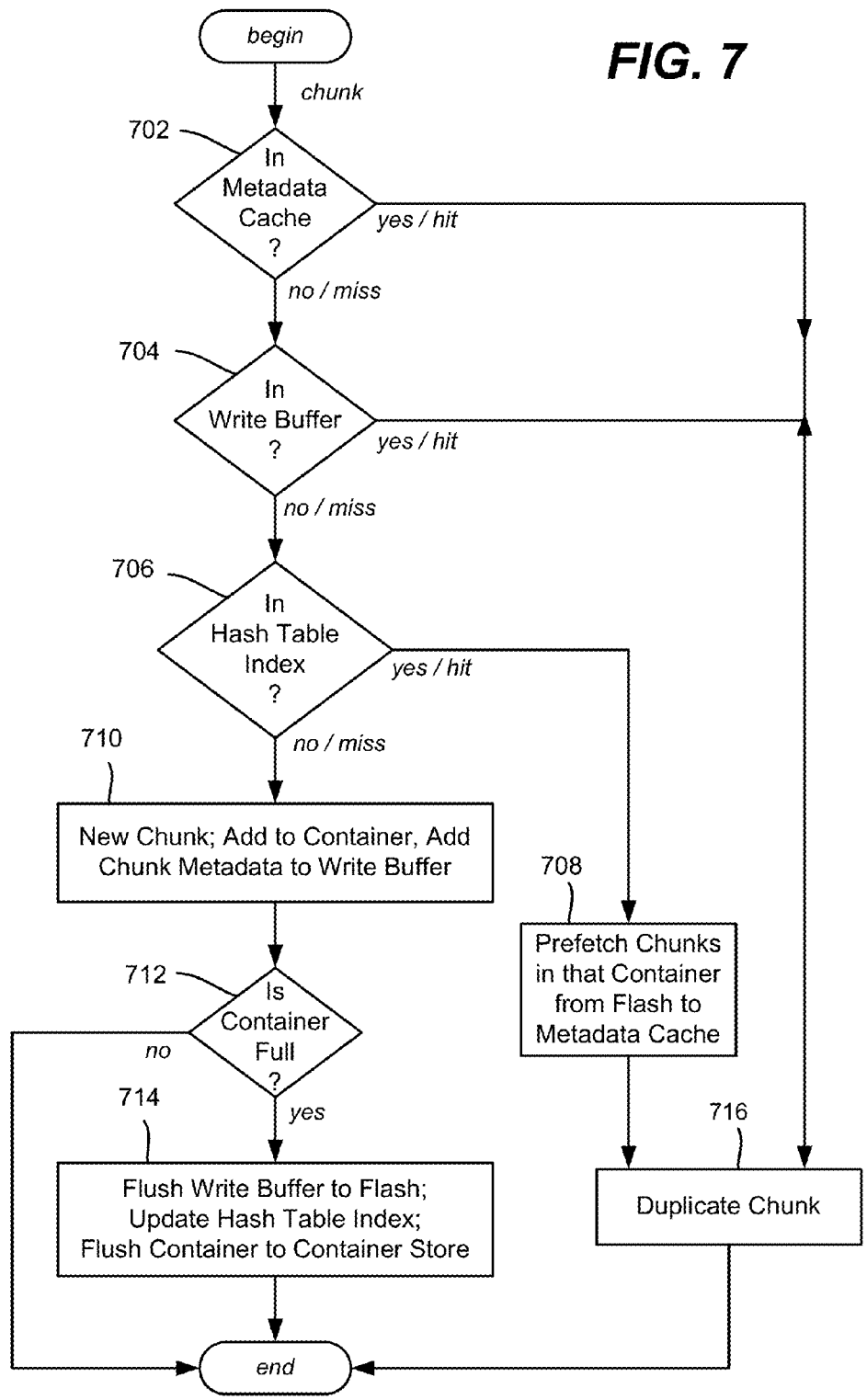
FIG. 7 is a flow diagram representing example steps taken by a flash-based deduplication system to handle chunks of incoming data.

FIG. 7 summarizes the hierarchical relationship of the different storage areas in the deduplication system, via a flow diagram showing a sequence of accesses during inline deduplication. When a new chunk comes into the system, its SHA-1 hash is first looked up to determine if the chunk is a duplicate one. If not, the new chunk-id is inserted into the system.

In the flash-based deduplication system, a chunk-id lookup operation looks up the RAM chunk metadata cache 612 as represented by step 702. If found, it is a duplicate chunk (step 716), and otherwise handled accordingly, e.g., the file/object pointer is updated to point to the existing chunk.

Upon a miss in the RAM chunk metadata cache 612, at step 704 the mechanism 622 looks for the key in the RAM chunk metadata write buffer 608, and if found, branches to step 716. If missed, at step 706 the mechanism 622 searches the RAM hash table index 610 to attempt to in order to locate the chunk-id in the flash store 604. If the chunk-id is present in the flash store 604, at step 708 its metadata, together with the metadata of the chunks in the respective container, is prefetched into the RAM chunk metadata cache, and the chunk handled as a duplicate at step 716.

A chunk-id insert operation happens when the chunk coming into the system has not been seen earlier, as represented by step 710. Step 710 represents a number operations, including writing the chunk metadata into the RAM chunk metadata write buffer; the chunk itself is appended to the currently open container buffered in RAM.

As evaluated by step 712, when the number of chunk entries in the RAM chunk metadata write buffer reaches the target (e.g., of 1024) for the current container, at step 714 the container is sealed and written to the container store on hard disk, and its associated chunk metadata entries are written to the flash store 604 and inserted to the RAM hash table index 610.

With respect to RAM and flash capacity considerations, the deduplication system is designed to use a small number of bytes in RAM per entry so as to maximize the RAM hash table index capacity for a given RAM usage size. The RAM hash table index capacity determines the number of chunk-ids stored on flash whose metadata can be accessed with one flash read. The RAM size for the hash table index 610 can be determined with application requirements in mind. With a two-byte compact key signature and four-byte flash pointer per entry, which is a total of six bytes per entry; a typical RAM usage of 4 GB per machine for the hash table index accommodates a maximum of about 715 million chunk-id entries. At an average of 8 KB size per data chunk, this accommodates about 6 TB of deduplicated data. With 64 bytes allocated for a chunk-id and its metadata, this corresponds to about 45 GB of chunk metadata.

For efficient inline deduplication, the entire chunk metadata for the (current) backup dataset is fit into the flash store 604. Otherwise, when space on flash runs out, the append log needs to be recycled and written from the beginning. When a page on the flash log is rewritten, the earlier one needs to be evicted and the metadata contained therein written out to a hard disk-based index; then, during the chunk-id lookup process, if the chunk is not found in flash, it will need to be looked up in the index on hard disk. Thus, unless fit into the flash store 604, both the chunk-id insert and lookup pathways potentially suffer from the same bottlenecks of disk index based systems As described herein, the system uses flash memory to store chunk metadata and index it from RAM, while providing flexibility for flash memory to serve, or not serve, as a permanent location for chunk metadata for a given storage location. This decision can be driven by cost considerations, for example, because of the difference in cost between flash memory and hard disk. The chunk metadata log on flash can be written to hard disk in one large sequential write (single disk I/O) to hard disk at the end of the backup process. At the beginning of the next full backup for this storage location, the chunk metadata log can be loaded back into flash from hard disk in one large sequential read (single disk I/O) and the containing chunks can be indexed in the RAM hash table index. This mode of operation amortizes the storage cost of metadata on flash across many backup datasets.

With respect to reducing the system RAM usage, the largest portion of RAM usage in the system comes from the hash table index 610. This usage can be reduced by indexing in RAM only a small fraction of the chunks at the beginning of each container (instead of the whole container). Note that the flash memory continues to hold metadata for all chunks in all containers, not just the ones indexed in RAM. Further, note that indexing chunks at the beginning of a container (versus uniformly at random over the container, for example) has benefits, including that because of sequential predictability of chunk-id lookups during second and subsequent full backups, the first few chunks in a container are effective predictors that the next several hundreds or thousands of chunks in the incoming stream will come from this container. As a result, the benefit of prefetching container metadata is the highest when one of its first few chunks is accessed. However, when only a subset of chunks stored in the system are indexed in the RAM hash table index, detection of duplicate chunks is not completely accurate, i.e., some incoming chunks that are not found in the RAM hash table index may have appeared earlier and are already stored in the system. This will lead to some loss in deduplication quality in that some amount of duplicate data chunks will be stored in the system. However, the quality reduction tends to be marginal with respect to the reduction in RAM usage, and thus this tradeoff is useful in many situations.

Exemplary Operating Environment

Figure 8:
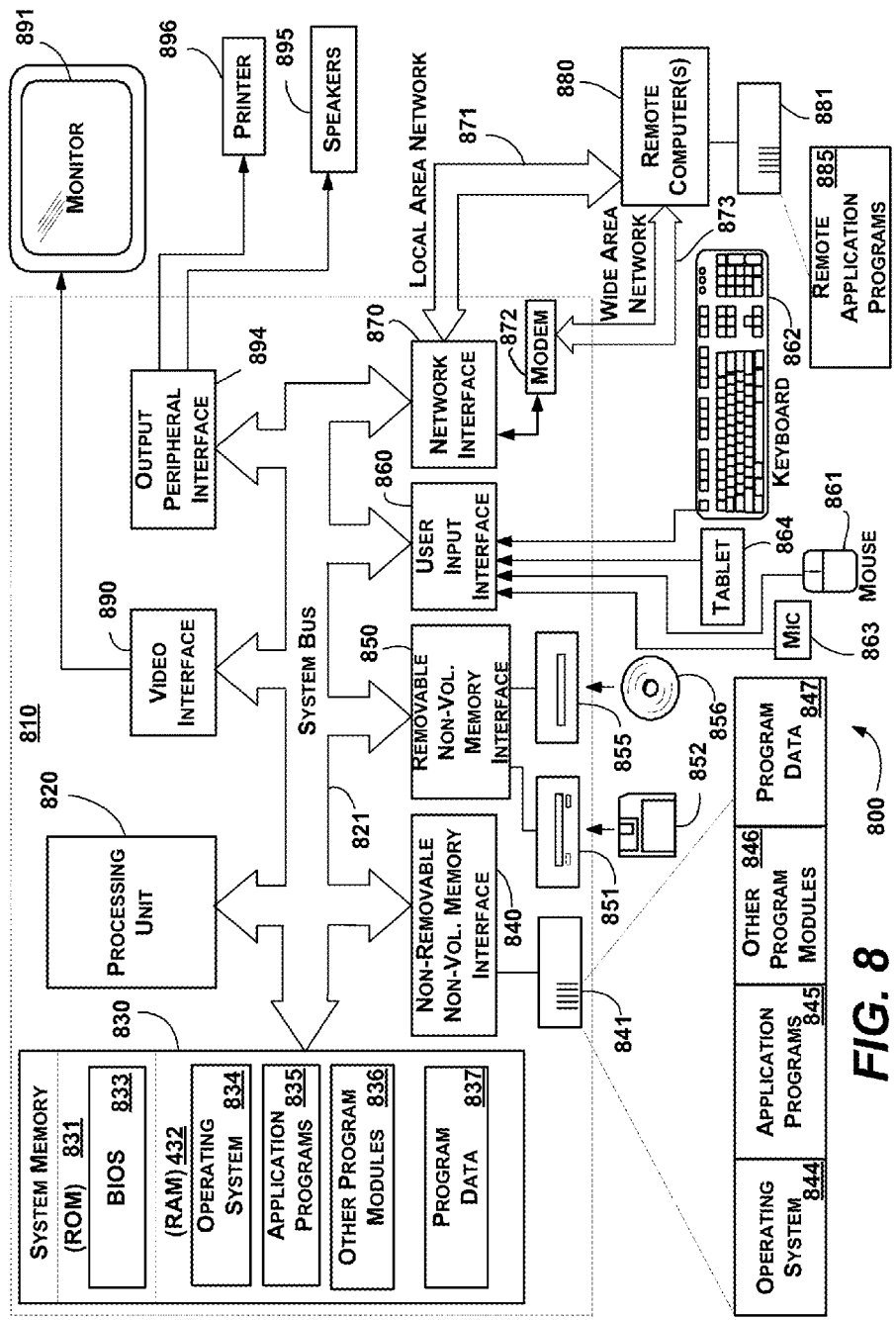
FIG. 8 shows an illustrative example of a computing environment into which various aspects of the present invention may be incorporated.

FIG. 8 illustrates an example of a suitable computing and networking environment 800 on which the examples of FIGS. 1-7 may be implemented. The computing system environment 800 is only one example of a suitable computing environment and is not intended to suggest any limitation as to the scope of use or functionality of the invention. Neither should the computing environment 800 be interpreted as having any dependency or requirement relating to any one or combination of components illustrated in the exemplary operating environment 800.

The invention is operational with numerous other general purpose or special purpose computing system environments or configurations. Examples of well-known computing systems, environments, and/or configurations that may be suitable for use with the invention include, but are not limited to: personal computers, server computers, hand-held or laptop devices, tablet devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, and so forth, which perform particular tasks or implement particular abstract data types. The invention may also be practiced in distributed computing environments where tasks are performed by remote processing devices that are linked through a communications network. In a distributed computing environment, program modules may be located in local and/or remote computer storage media including memory storage devices.

With reference to FIG. 8, an exemplary system for implementing various aspects of the invention may include a general purpose computing device in the form of a computer 810. Components of the computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 810 typically includes a variety of computer-readable media. Computer-readable media can be any available media that can be accessed by the computer 810 and includes both volatile and nonvolatile media, and removable and non-removable media. By way of example, and not limitation, computer-readable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by the computer 810. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above may also be included within the scope of computer-readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, application programs 835, other program modules 836 and program data 837.

The computer 810 may also include other removable/non-removable, volatile/nonvolatile computer storage media. By way of example only, FIG. 8 illustrates a hard disk drive 841 that reads from or writes to non-removable, nonvolatile magnetic media, a magnetic disk drive 851 that reads from or writes to a removable, nonvolatile magnetic disk 852, and an optical disk drive 855 that reads from or writes to a removable, nonvolatile optical disk 856 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through a non-removable memory interface such as interface 840, and magnetic disk drive 851 and optical disk drive 855 are typically connected to the system bus 821 by a removable memory interface, such as interface 850.

The drives and their associated computer storage media, described above and illustrated in FIG. 8, provide storage of computer-readable instructions, data structures, program modules and other data for the computer 810. In FIG. 8, for example, hard disk drive 841 is illustrated as storing operating system 844, application programs 845, other program modules 846 and program data 847. Note that these components can either be the same as or different from operating system 834, application programs 835, other program modules 836, and program data 837. Operating system 844, application programs 845, other program modules 846, and program data 847 are given different numbers herein to illustrate that, at a minimum, they are different copies. A user may enter commands and information into the computer 810 through input devices such as a tablet, or electronic digitizer, 864, a microphone 863, a keyboard 862 and pointing device 861, commonly referred to as mouse, trackball or touch pad. Other input devices not shown in FIG. 8 may include a joystick, game pad, satellite dish, scanner, or the like. These and other input devices are often connected to the processing unit 820 through a user input interface 860 that is coupled to the system bus, but may be connected by other interface and bus structures, such as a parallel port, game port or a universal serial bus (USB). A monitor 891 or other type of display device is also connected to the system bus 821 via an interface, such as a video interface 890. The monitor 891 may also be integrated with a touch-screen panel or the like. Note that the monitor and/or touch screen panel can be physically coupled to a housing in which the computing device 810 is incorporated, such as in a tablet-type personal computer. In addition, computers such as the computing device 810 may also include other peripheral output devices such as speakers 895 and printer 896, which may be connected through an output peripheral interface 894 or the like.

The computer 810 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 810, although only a memory storage device 881 has been illustrated in FIG. 8. The logical connections depicted in FIG. 8 include one or more local area networks (LAN) 871 and one or more wide area networks (WAN) 873, but may also include other networks. Such networking environments are commonplace in offices, enterprise-wide computer networks, intranets and the Internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. The modem 872, which may be internal or external, may be connected to the system bus 821 via the user input interface 860 or other appropriate mechanism. A wireless networking component such as comprising an interface and antenna may be coupled through a suitable device such as an access point or peer computer to a WAN or LAN. In a networked environment, program modules depicted relative to the computer 810, or portions thereof, may be stored in the remote memory storage device. By way of example, and not limitation, FIG. 8 illustrates remote application programs 885 as residing on memory device 881. It may be appreciated that the network connections shown are exemplary and other means of establishing a communications link between the computers may be used.

An auxiliary subsystem 899 (e.g., for auxiliary display of content) may be connected via the user interface 860 to allow data such as program content, system status and event notifications to be provided to the user, even if the main portions of the computer system are in a low power state. The auxiliary subsystem 899 may be connected to the modem 872 and/or network interface 870 to allow communication between these systems while the main processing unit 820 is in a low power state.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. In a computing environment, a system comprising:
a secondary storage device including data items; and
a RAM-based index that contains one or more pointers for determining location of the data items in the secondary storage device, at least one of the one or more pointers is divided into a first subspace and a second subspace, the first subspace pointing to a location in RAM, and the second subspace pointing to a location in the secondary storage device.

2. The system of claim 1, wherein the RAM-based index includes a truncated cuckoo hash table, in which an entry of the RAM-based index comprises a compact footprint checksum and a pointer to a page, the RAM-based index of each data item configured for storage in one of a plurality of locations in the table, and wherein the compact footprint checksum validates whether the data item is stored in the page.

3. The system of claim 1, wherein the data items comprise key-value pairs, with the key and associated value comprising arbitrary byte arrays.

4. The system of claim 1, wherein the secondary storage device comprises at least one of a non-volatile memory devices or a hard drive device.

5. The system of claim 1, further comprising: a storage mechanism configured to store the data items to the secondary storage device, including writing the data items to a page and inserting a compact index of the data items into the RAM-based index.

6. The system of claim 5, wherein the storage mechanism further comprises a RAM-based write buffer configured to maintain the data items to be written to the secondary storage, and wherein the storage mechanism is configured to write a page of the data items from the RAM-based write buffer to the secondary storage device when the data items fill a page, or writes less than a page of the data items from the RAM-based write buffer to the secondary store device when a coalesce time is reached.

7. The system of claim 1, wherein the secondary storage device comprises a flash store, and further comprising a disk-based storage and a recycle mechanism that makes a page in the flash store again available for use by destaging at least some of the data items from the flash store to the disk-based storage.

8. The system of claim 7, wherein the recycle mechanism includes an oldest first policy, least recently used policy, or first-in, first out policy.

9. The system of claim 1, wherein the secondary storage device comprises a flash store, and further comprising a data structure that includes information that indicates to a high probability whether a data item has been recently accessed, and a recycle mechanism that makes a page in the flash store available by processing valid data items on the page, including destaging a data item from the page in the flash store to a disk-based storage or reinserting the data item into a RAM-based write buffer to be written back to the flash store, based on whether the information in the data structure indicates that the data item has been recently accessed.

10. The system of claim 1, wherein the data items in the secondary storage device are checked whether the data items are pointed by the pointers in the RAM-based index.

11. In a computing environment, a method performed on at least one processor, comprising:
maintaining key-value pairs in a secondary storage device; and
maintaining a RAM-based index with compact index that contains one or more pointers to determine whether the key-value pairs are located in the secondary storage device, at least one of the one or more pointers is divided into a first subspace and a second subspace, the first subspace pointing to a location in RAM, and the second subspace pointing to a location in the secondary storage.

12. The method of claim 11 further comprising, writing the key-value pairs to the secondary storage device, and adding an entry into the RAM-based index for the key-value pairs.

13. The method of claim 12 further comprising, looking for a key in the RAM-based index, wherein looking for the key of the key-value pair is performed by a first thread, wherein writing the key-value pair is performed by a second thread, and wherein a recycling process is performed by a third thread, in which at least one of the threads uses a locking mechanism.

14. The method of claim 11, wherein the RAM-based index comprises a truncated cuckoo hash table, wherein an entry of the RAM-based index comprises a compact checksum and one of the one or more pointers, wherein each key is stored in one of multiple locations in the RAM-based index with the locations determined by multiple hash functions, wherein a compact checksum is calculated for each of the locations and its associated key, wherein looking up the key comprises checking the multiple locations in the RAM-based index whether the stored checksum matches the checksum of the associated key, and wherein the pointers of the locations with a checksum match are returned as the pointers to a location in which the key-value pairs may be stored.

15. The method of claim 14, wherein when the key does not exist in the secondary storage device, no pointers are retrieved, or if one or more of the pointers are retrieved, the method further comprises checking content pointed to by the one or more of the pointers to validate if the key is stored in the location, and if so, returning the value of the key-value pair.

16. The method of claim 12, wherein writing the key-value pairs into the secondary storage device includes appending the key-value pair to a logical end of the secondary storage device, retrieving one or more of the pointers of the existing key in the RAM-based index, checking the one or more of the pointers to determine if a previous version of the key-value pair is stored in the secondary storage device and the RAM-based index, and
if the previous version of the key-value pair exists, replacing the one or more of the pointers to the previous version of the key-value pair with the one or more of the pointers to a new version of the key-value pair and rendering the previous version of the key-value pair as not pointed to by any of the pointers in the RAM-based index to thereby be processed by a recycling process, and
if no previous version of the key-value pair exists, storing the one or more of the pointers of a new version of the key-value pair in an unoccupied locations if one exists, and if no unoccupied location is found, relocating the one of pointers stored in an occupied location to an alternative location or destaging the one of the pointers and the associated key-value pair to another storage device.

17. The method of claim 16, wherein relocating the one of the pointers includes:
(a) retrieving keys associated with the one of the pointers as potential relocation candidates,
(b) finding an alternative location for each of the relocation candidates,
(c) if an unoccupied alternative location is found, relocating the relocation candidate,
(d) and if all alternative locations of all relocation candidates are occupied, adding the keys at all the alternative locations as relocation candidates.

18. The method of claim 16, wherein the recycling process treats the content stored in the secondary storage device as a stream, and for each key-value pair in the secondary storage device, checks if it is pointed by a pointer in the RAM-based index, and if pointed to, performs: copying the key-value pair into a new stream; garbage collecting at least a portion of a previous stream, and periodically check pointing the RAM-based index into a storage device in association with a current end position of the key-value store stream for use in crash recovery.

19. The method of claim 11 further comprising, looking for a key by accessing the RAM-based index to look for one or more locations of a key-value pair in the secondary storage device.

20. In a computing environment, a system comprising, a secondary storage device, a compact RAM-based index corresponding to data items in the secondary storage device, and a mechanism that resolves RAM-based index collisions comprising more than one data item having a common storage location with a common checksum in the RAM-based index, the mechanism resolving the collision by moving at least one index entry to another location that does not correspond to a collision, or if no other location is found after one or more attempts, by destaging a data item from the secondary storage device to a third storage device and removing a corresponding index entry for that data item from the hash table index.

* * * * *